(12) United States Patent
Buller et al.

(10) Patent No.: US 9,640,679 B2
(45) Date of Patent: May 2, 2017

(54) PHOTOVOLTAIC DEVICE WITH OXIDE LAYER

(75) Inventors: Benyamin Buller, Sylvania, OH (US); Markus Gloeckler, Perrysburg, OH (US); Rui Shao, Sylvania, OH (US); Yu Yang, Perrysburg, OH (US); Zhibo Zhao, Novi, MI (US); Chungho Lee, San Jose, CA (US)

(73) Assignee: FIRST SOLAR, INC., Perrysburg, OH (US)

( * ) Notice: Subject to any disclaimer, the term of this patent is extended or adjusted under 35 U.S.C. 154(b) by 333 days.

(21) Appl. No.: 13/208,118

(22) Filed: Aug. 11, 2011

(65) Prior Publication Data

US 2012/0037201 A1     Feb. 16, 2012

Related U.S. Application Data

(60) Provisional application No. 61/373,696, filed on Aug. 13, 2010.

(51) Int. Cl.

| | |
|---|---|
| H01L 31/0224 | (2006.01) |
| H01L 31/0296 | (2006.01) |
| H01L 31/073 | (2012.01) |
| H01L 31/18 | (2006.01) |
| C23C 14/08 | (2006.01) |
| C23C 14/58 | (2006.01) |
| C23C 16/40 | (2006.01) |
| C03C 17/245 | (2006.01) |
| C03C 17/34 | (2006.01) |

(52) U.S. Cl.
CPC .. *H01L 31/022466* (2013.01); *C03C 17/2453* (2013.01); *C03C 17/3417* (2013.01); *C23C 14/086* (2013.01); *C23C 14/5806* (2013.01); *C23C 16/407* (2013.01); *H01L 31/0296* (2013.01); *H01L 31/073* (2013.01); *H01L 31/1828* (2013.01); *H01L 31/1884* (2013.01); *C03C 2217/232* (2013.01); *C03C 2217/94* (2013.01); *Y02E 10/543* (2013.01); *Y02P 70/521* (2015.11)

(58) Field of Classification Search
USPC .................................................. 136/255, 260
See application file for complete search history.

(56) References Cited

U.S. PATENT DOCUMENTS

| | | | | |
|---|---|---|---|---|
| 4,349,425 | A | * | 9/1982 | Miyake ............... C03C 17/2453 204/192.15 |
| 4,729,970 | A | * | 3/1988 | Nath et al. ......................... 438/4 |
| 5,578,502 | A | * | 11/1996 | Albright ......... H01L 31/022425 257/E27.125 |
| 5,922,142 | A | | 7/1999 | Wu et al. |

(Continued)

OTHER PUBLICATIONS

C. M. Ronconi, et al., "Factorial design preparation of transparent conducting oxide thin films", Thin Solid Films 517, p. 2886-2891 (2009).*

(Continued)

*Primary Examiner* — Eric R Smith
(74) *Attorney, Agent, or Firm* — Blank Rome LLP

(57) ABSTRACT

A method of manufacturing a photovoltaic device may include concurrently transforming a transparent conductive oxide layer from a substantially amorphous state to a substantially crystalline state and forming one or more semiconductor layers.

34 Claims, 3 Drawing Sheets

(56) References Cited

U.S. PATENT DOCUMENTS

| | | | |
|---|---|---|---|
| 6,137,048 A | | 10/2000 | Wu et al. |
| 7,597,964 B2 | | 10/2009 | Krasnov |
| 2009/0075067 A1 | * | 3/2009 | Myli .................... C03C 17/002 428/333 |
| 2009/0084438 A1 | * | 4/2009 | den Boer et al. ............. 136/256 |
| 2009/0126791 A1 | * | 5/2009 | Lu .................... B32B 17/10036 136/258 |
| 2009/0194165 A1 | * | 8/2009 | Murphy et al. ............... 136/260 |
| 2009/0223556 A1 | | 9/2009 | Niesen et al. |
| 2010/0071810 A1 | * | 3/2010 | Nadaud .................... C03C 17/09 148/400 |
| 2010/0184249 A1 | * | 7/2010 | Chen ................ H01L 31/02963 438/72 |
| 2010/0186815 A1 | | 7/2010 | Yang et al. |
| 2011/0061736 A1 | | 3/2011 | Addepalli et al. |
| 2011/0143478 A1 | * | 6/2011 | Pavol .................... C23C 14/568 438/57 |

OTHER PUBLICATIONS

Definition of "matrix" [retrieved from internet at http://www.thefreedictionary.com/matrix on Apr. 10, 2014].*

J. M. Blackmore and A. F. Cattell, "Properties of two-phase cadmium stannate thin films", Thin Solid Films 185, p. 97-110 (1990).*

R. Mamazza Jr. et al., "Transparent conducting oxide thin films of Cd2SnO4 prepared by RF magnetron co-sputtering of the constituent binary oxides", Thin Solid Films 484, p. 26-33 (2005).*

B. E. McCandless et al., "Vapor transport deposition of cadmium telluride films", Conference Record of the Twenty-Ninth IEEE Photovoltaic Specialists Conference, May 19-24, 2002.*

X. Wu et al., "Recent developments in RF sputtered cadmium stannate films", Thin Solid Films 286, p. 274-276 (1996).*

T. J. Coutts, et al. "Search for improved transparent conducting oxides: A fundamental investigation of CdO, Cd2SnO4, and Zn2SnO4", Journal of Vacuum Science and Technology A 18, p. 2646-2660 (2000).*

Wu et al., "A Novel Manufacturing Process for Fabricating CdS/CdTe Polycrystalline Thin-Film Solar Cells", 16th European Photovoltaic Solar Energy Conference, May 1, 2000, pp. 341-344, vol. 16.

Wu et al., "High-efficiency $Cd_2SnO_4/Zn_2SnO_4/Zn_xCd_{1-x}S/CdS/CdTe$ polycrystalline thin-film solar cells", Proceedings of 28th IEEE Photovoltaic Specialists Conference, Sep. 15, 2000, pp. 470-474.

* cited by examiner

PHOTOVOLTAIC DEVICE WITH OXIDE LAYER

CLAIM OF PRIORITY

This application claims priority under 35 U.S.C. §119(e) to U.S. Provisional Patent Application Ser. No. 61/373,696 filed on Aug. 13, 2010, which is hereby incorporated by reference in its entirety.

TECHNICAL FIELD

The present invention relates to photovoltaic devices and methods of production.

BACKGROUND

Photovoltaic devices can include one or more materials formed over a substrate, for example, with a first layer serving as a window layer and a second layer serving, as an absorber layer. The semiconductor window layer can allow the penetration of solar radiation to the absorber layer, such as a cadmium telluride layer, which converts solar energy to electricity. During the manufacturing process, one or more heating steps may be used to transform one or more layers.

DETAILED DESCRIPTION

Figure 1:
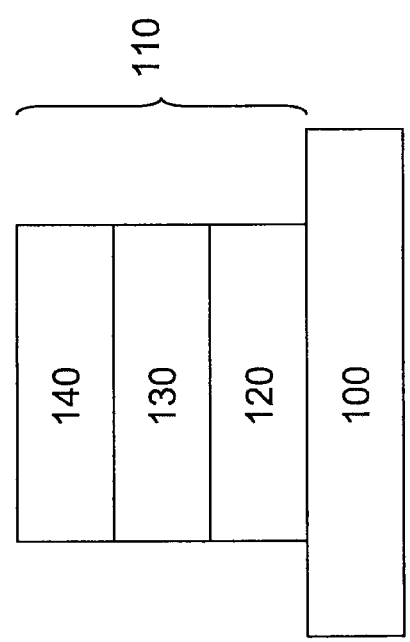
FIG. 1 is a schematic of a multilayered substrate.

Photovoltaic devices can include multiple layers created on a substrate (or superstrate). For example, a photovoltaic device can include a barrier layer, a transparent conductive oxide (TCO) layer, a buffer layer, and a semiconductor layer formed in a stack on a substrate. Each layer may in turn include more than one layer or film. For example, the semiconductor layer can include a first film including a semiconductor window layer, such as a cadmium sulfide layer, formed on the buffer layer and a second film including a semiconductor absorber layer, such as a cadmium telluride layer formed on the semiconductor window layer. Additionally, each layer can cover all or a portion of the device and/or all or a portion of the layer or substrate underlying the layer. For example, a "layer" can include any amount of any material that contacts all or a portion of a surface.

In a typical photovoltaic device, a TCO layer can be used as a front contact. A TCO stack may consist of multiple layers deposited on glass, with a barrier layer adjacent to the glass substrate, a TCO layer to on the barrier layer, and a buffer layer on the TCO layer. For example, a barrier layer may be sputtered using targets of silicon or silicon doped with boron or aluminum. A gas mixture of argon and oxygen may be incorporated into the deposition chamber during sputtering. The argon-to-oxygen flow ratios may be controlled from more than about 30%, more than about 40%, more than about 50%, less than about 80%, or less than about 70%. For example, the argon-to-oxygen flow ratios may be controlled to about 50% to about 75%. This may lead to a high deposition rate for aluminum-doped silicon oxide coatings, which are still free of optical absorptions. The barrier layer may have a preferred thickness (e.g., from about 500 A to about 3000 A).

The TCO layer can be deposited using any suitable method, including, for example, via reactive sputtering using metallic targets with properly selected alloy compositions. In the case of cadmium stannate, cadmium and tin alloy targets with compositions in the vicinity of a 2:1 atomic ratio may be used. A sputter-deposited cadmium stannate layer generally has an amorphous structure (i.e., an amorphous oxide of cadmium-tin). As its deposited state, the cadmium stannate layer is highly absorptive optically and resistive electrically. Thus it cannot serve as a useful front contact for a photovoltaic device without certain post-deposition heat treatment. Instead, the deposited cadmium stannate film(s) must undergo an amorphous-to-crystalline phase transformation. A variety of techniques are available to achieve the transformation, including, for example, a separate post-sputtering annealing process prior to deposition of semiconductor layers, or thermal heating associated with a high-temperature deposition process for semiconductor layers.

There are several drawbacks associated with using a separate annealing process. For example, a separate annealing process would require additional costs for equipment and processing. Further, the additional processing would result in various undesired effects due to atomic migrations aggravated by the thermal annealing process. For example, additional annealing may cause high levels of impurities, which may adversely affect device stability and reliability. While the impurity-related problems can be mitigated by use of thicker barriers, the increase in barrier thickness may also add additional cost.

A preferred approach would thus be to anneal the TCO stack concurrently with deposition of the semiconductor layers. Any suitable technique may be used for semiconductor deposition, including, for example, close space sublimation (CSS) or vapor transport deposition (VTD). These processes are inherently associated with high substrate temperatures. For example, a VTD deposition chamber may include a belt furnace with controlled ambient condition and a multiple zone structure. The temperatures at different zones can be controlled independently by adjusting setpoints of heaters. With a properly conditioned TCO stack during the sputtering process, the transformation can be achieved during deposition of the semiconductor layers.

Desired TCO properties can be obtained by properly manipulating zone temperatures in the VTD coater. The sputtering conditions for the TCO stack, particularly the deposition rate and argon-oxygen gas ratio in the sputtering chamber, can strongly affect how the TCO layer transforms during deposition of the cadmium sulfide and cadmium telluride. Gas mixtures with 0% to 5% argon flow can be used to "condition" (promote) the TCO stack to be more transformable. A preferred TCO layer thickness (e.g., from about 1500 A to about 3000 A) may also be used.

The buffer layer may include any suitable material, including, for example, tin oxide, indium oxide, zinc oxide, zinc tin oxide, and other suitable combinations of high resistance and yet conductive oxides. The buffer layer can be deposited using any suitable technique, including, for example, reactive sputtering using metallic targets with properly selected metal or alloy compositions. The deposition environment may contain a substantial quantity of oxygen, including, for example, about 100% oxygen. The buffer layer may have a preferred thickness (e.g., from about 200 A to about 2000 A).

The layers within the TCO stack can be formed using any of a variety of deposition techniques, including, for example, low pressure chemical vapor deposition, atmospheric pressure chemical vapor deposition, plasma-enhanced chemical vapor deposition, thermal chemical vapor deposition, DC or AC sputtering, spin-on deposition, or spray-pyrolysis.

As described above, to facilitate transformation during deposition of the cadmium sulfide and cadmium telluride layers, the film(s) can be deposited under preferred conditions. A number of conditions/factors may have a positive effect on the cadmium stannate transformation, i.e. enabling the conversion of an amorphous film to a transparent conductive oxide to be achieved at reduced thermal loads during a post-deposition annealing process. For example, a moderate heating of the substrate during deposition of the cadmium stannate films may be desirable. While not necessarily sufficient to form crystalline cadmium stannate, such heating may enable formation of nano- or microcrystallites in an amorphous matrix. These crystallites can in turn serve as seeds or nuclei during subsequent annealing processes, which may facilitate amorphous-crystalline transformation. Furthermore, an oxygen-depleting or reducing ambient condition during the post-deposition annealing may be highly beneficial or even necessary to convert the amorphous layer of cadmium and tin.

In a VTD deposition process, the cadmium sulfide vapor used for deposition provides a somewhat reducing or oxygen depleting environment, which is essential to convert the sputtered layer. The cadmium sulfide layer on top of the stack further isolates the stack from the ambient before it is subjected to high temperatures. The zone temperature and duration of the semiconductor deposition may also have a significant impact. The anneal time is largely dictated by the time needed to complete semiconductor deposition. Thus the most useful variables affecting cadmium stannate transformation are the zone temperatures used at various stages of the semiconductor deposition (i.e., before, during, and after). Generally, the zone temperatures are set such that the actual plate temperature is maintained above the critical temperature for cadmium stannate transformation starting from the step of cadmium sulfide deposition until the plate enters the quenching zone. In the case of a cadmium stannate stack, the critical temperature is estimated to be about 590 C to about 600 C. The overall thermal load will be sufficiently high to achieve sheet resistance below 8 ohms/square and overall optical absorption below 6% within the spectrum of about 400 nm to about 850 nm, for a properly designed TCO stack.

The coater may include multiple zones, including, for example, more than one zone, more than three zones, more than five zones, more than eight zones, more than ten zones, less than fifteen zones, or less than twelve zones. For example, the coater may include eleven zones, with the first four zones designated for steps taking place before cadmium sulfide deposition, and the latter zones designated for steps taking place during or after cadmium sulfide deposition. Each of the zones may be set at any suitable temperature, including, for example, more than about 400 C, more than about 550 C, more than about 600 C, more than about 650 C, more than about 700 C, or less than about 800 C. For example, the pre-cadmium sulfide deposition zones (e.g., zones 1-4) may be set to about 600 C, or about 650 C, or a temperature between 600 C and 650 C, such as about 620 C. The cadmium sulfide and post-cadmium sulfide deposition zones (e.g., zones 5-11) may be set to about 600 C, or about 650 C, or a temperature between 600 C and 650 C, such as about 610 C. These settings may ensure that the glass substrate maintains a temperature above the critical temperature for cadmium stannate transformation before the glass quenching/cooling step. The annealing time between the first four zones can be between about 1 to about 5 minutes, or between about 3 to about 4 minutes (e.g., about 3.5 minutes). The time between the latter zones can be between about 2 and 10 minutes, or between about 4 and 6 minutes (e.g., about 5 minutes or about 6 minutes).

Several benefits are evident from the aforementioned methods and configurations. By annealing the TCO stack during semiconductor deposition, the need for a separate annealing process (and the additional costs and equipment associated therewith) can be eliminated. With the elimination of the separate annealing process, the TCO stack (along with its glass substrate) may be subject to significantly reduced thermal load. This allows the use of a thinner barrier layer.

Use of the aforementioned methods and configurations may also lead to higher device efficiency, lower impurity levels, reduced glass breakage, improved module visual appearance, minimization of defects in the cadmium sulfide layer, and improved cadmium sulfide layer distribution. For example, experimental results have yielded TCO stacks having about 6 to about 8 ohms/square sheet resistance, and about 5% to about 6% average optical absorption between 400nm to about 850 nm. Elimination of the separate annealing process for transforming the cadmium stannate stack can reduce impurity levels by several orders of magnitude.

To maintain mechanical strength and minimize glass breakage, balanced stress states may be introduced by properly cooling following a glass annealing process. Using a separate annealing process for transforming the cadmium stannate would subject the stack (and substrate) to two high-temperature processes. The temperatures in both processes can be substantially high (e.g., more than about 500 C), and potentially close or even higher than the softening temperature of glass substrates. The dual high temperature processes can complicate the stress states and the shape of the glass plates, which may make them more prone to breakage. Further, with a separate annealing process, latent non-uniformities in the TCO stacks may be "magnified." In general, the non-uniformities tend to affect the visual appearance. Modules fabricated without a separate annealing process may show significant improvement visually.

In one aspect, a method of manufacturing a photovoltaic device may include forming an amorphous oxide adjacent to a substrate. The method may include transforming the amorphous oxide into a crystalline transparent conductive oxide during or after deposition of a semiconductor layer adjacent to the amorphous oxide layer.

The transforming may include transporting a vapor. The transforming may occur during deposition of the semiconductor layer. Deposition of the semiconductor layer may occur in an oxygen-depleted environment. The oxygen-depleted environment may be provided by depositing a cadmium sulfide layer as part of the semiconductor layer. The transforming may include using close space sublimation to form a semiconductor bi-layer. Forming an amorphous oxide may include sputtering an amorphous layer of cadmium and tin. Forming an amorphous oxide may include sputtering an amorphous layer of cadmium and tin from a sputter target comprising a cadmium to tin ratio of about 2:1. Forming an amorphous oxide may include sputtering an amorphous layer of cadmium and tin in an atmosphere comprising an argon and oxygen gas mix. The atmosphere may include about 0% to about 5% argon gas. Forming an amorphous oxide may include sputtering a layer having a thickness of more than about 1200 A. Forming an amorphous oxide may include sputtering a layer having a thickness of less than about 4000 A. The method may include forming a barrier layer. Forming a barrier layer may include sputtering an aluminum-doped silicon oxide or a silicon oxide. Forming a barrier layer may include sputtering a barrier material in an atmosphere comprising an oxygen and argon gas mix. The oxygen and argon gas mix may include an argon to oxygen gas ratio of about 5:1 or less. The oxygen and argon gas mix may include an argon to oxygen gas ratio of about 1:5 or more. Forming a barrier layer may include sputtering a barrier material that is substantially free of optical absorptions. Forming a barrier layer may include sputtering a barrier material having a thickness of more than about 250 A. Forming a barrier layer may include sputtering a material having a thickness of less than about 4000 A. The method may include forming a buffer layer. Forming a buffer layer may include sputtering a tin oxide, indium oxide, zinc oxide, or zinc tin oxide. Forming a buffer layer may include sputtering a buffer layer having a thickness of more than about 100 A. Forming a buffer layer may include sputtering a buffer layer having a thickness of less than about 2500 A. Forming a buffer layer may include sputtering a buffer material in an atmosphere including oxygen gas. The atmosphere may include more than about 90% oxygen. The method may include exposing the amorphous oxide to a first temperature prior to deposition of a cadmium sulfide layer. The cadmium sulfide layer may be part of the semiconductor layer. The first zone temperature may include more than about 500 C. The first zone temperature may include less than about 700 C. The first zone temperature may include about 600 C to about 700 C. Forming a semiconductor layer may include exposing the amorphous oxide to a second zone temperature during or after deposition a cadmium sulfide layer. The cadmium sulfide layer may be part of the semiconductor layer. The second zone temperature may be more than about 550 C. The second zone temperature may include less than about 650 C. The second temperature may be about 550 C to about 650 C. The crystalline transparent conductive oxide may include a sheet resistance of below about 10 ohm/square or below about 8 ohm/square. The crystalline transparent conductive oxide may include an average optical absorption of less than about 10% or less than about 7% from the substrate. Forming a semiconductor bi-layer may include exposing the amorphous oxide to a first temperature and a second temperature. The first temperature may be less than the second temperature. The first temperature may be more than about 300 C. The first temperature may be less than about 500 C. The second temperature may be more than about 500 C. The second zone temperature may be less than about 700 C. The method may include forming a stack. The stack may include a barrier layer, the amorphous oxide, and a buffer layer. The method may include forming a semiconductor bi-layer. Forming a semiconductor bi-layer may include transporting the stack to a first deposition zone. The method may include forming a cadmium sulfide layer on the stack at the first deposition zone. The method may include transporting the stack from the first deposition zone to a second deposition zone. The method may include forming a cadmium telluride layer on the cadmium sulfide layer at the second deposition zone. The semiconductor layer may include a cadmium telluride layer adjacent to a cadmium sulfide layer.

In one aspect, a method of manufacturing a photovoltaic module may include fabricating a plurality of photovoltaic cells. The fabricating may include forming a barrier layer adjacent to a substrate. The fabricating may include forming an amorphous oxide adjacent to the barrier layer. The fabricating may include forming a buffer layer adjacent to the amorphous oxide. The fabricating may include transforming the amorphous oxide into a crystalline transparent conductive oxide during or after deposition of a semiconductor layer adjacent to the amorphous oxide layer. The method may include connecting a plurality of photovoltaic cells. The transformation step may include the step of forming a semiconductor bi-layer. The method may include depositing a back cover adjacent to the plurality of photovoltaic cells.

In another aspect, a multilayered structure can include a substrate, an amorphous oxide layer adjacent to the substrate, and a semiconductor window layer adjacent to the amorphous oxide layer. The amorphous oxide layer can include cadmium and tin. The amorphous oxide layer can have a thickness between about 1200 A and about 4000 A. The amorphous oxide layer can be capable of being transformed into a crystalline transparent conductive oxide layer during or after deposition of the semiconductor window layer. The semiconductor window layer can include cadmium sulfide. The multilayered structure can include a semiconductor absorber layer adjacent to the semiconductor window layer. The amorphous oxide layer can be capable of being transformed into a crystalline transparent conductive oxide layer during or after deposition of the semiconductor absorber layer. The semiconductor absorber layer can include cadmium telluride.

The multilayered structure can include a barrier layer between the substrate and the amorphous oxide layer. The barrier layer can have a thickness of between about 250 A and about 4000 A. The multilayered structure can include a buffer layer between the amorphous oxide layer and the semiconductor window layer. The buffer layer can have a thickness of between about 100 A and about 2500 A.

In another aspect, a photovoltaic device can include a substrate and a crystalline transparent conductive oxide layer adjacent to the substrate. The crystalline transparent conductive oxide layer can include cadmium and tin. The crystalline transparent conductive oxide layer can include a sheet resistance less than about 10 ohm/square or less than about 8 ohm/square and an average optical absorption of less than about 10% or less than about 7% from the substrate. The photovoltaic device can include a semiconductor window layer adjacent to the crystalline transparent conductive oxide layer. The photovoltaic device can include a semiconductor absorber layer adjacent to the semiconductor window layer. The photovoltaic device can include a back contact layer adjacent to the semiconductor absorber layer.

In another aspect, a photovoltaic module can include a substrate and a plurality of photovoltaic devices adjacent to the substrate. At least one of the plurality of photovoltaic devices can include a crystalline transparent conductive oxide layer adjacent to the substrate. The crystalline transparent conductive oxide layer can include cadmium and tin. The crystalline transparent conductive oxide layer can include a sheet resistance less than about 10 ohm/square or less than about 8 ohm/square and an average optical absorption of less than about 10% or less than about 7% from the substrate. The photovoltaic device can include a semiconductor window layer adjacent to the crystalline transparent conductive oxide layer. The photovoltaic device can include a semiconductor absorber layer adjacent to the semiconductor window layer. The photovoltaic device can include a back contact layer adjacent to the semiconductor absorber layer. The photovoltaic module can include a back cover adjacent to the back contact layer.

Referring to FIG. 1, by way of example, barrier layer 120 may be formed adjacent to a substrate 100. Substrate 100 may include any suitable material, including, for example, a glass. For example, substrate 100 may include any suitable soda-lime glass, or any suitable solar float glass. Barrier layer 120 may include any suitable material, including, for example, an aluminum-doped silicon oxide, silicon oxide, silicon nitride, silicon oxynitride or aluminum oxide. Barrier layer 120 can be transparent, thermally stable, with a reduced number of pin holes and having high sodium-blocking capability, and good adhesive properties. Barrier layer 120 can include any suitable number of layers and may have any suitable thickness, including, for example, more than about 500 A, more than about 750 A, more than about 1200 A, less than about 3000 A or less than about 1500 A. For example, barrier layer 120 may have a thickness of about 2000 A or less.

Barrier layer 120 may be formed using any suitable technique, including, for example, atmospheric pressure chemical vapor deposition, or any suitable reactive sputtering process. Barrier layer 120 may be deposited in the presence of one or more gases, for example, oxygen and/or argon gas. For example, barrier layer 120 may include a silicon aluminum oxide sputtered in the presence of an oxygen/argon gas mix. Any suitable concentration of oxygen and/or argon gas may be incorporated into the deposition chamber during sputtering of barrier layer 120. For example, barrier layer 120 may be sputtered in an atmosphere including an argon to oxygen ratio of more than about 1:2, more than about 1:5, more than about 2:5, more than about 2:3, more than about 3:4 or more than about 3:5. Barrier layer 120 may be sputtered from a target containing silicon. The sputter target may include any suitable dopant, including, for example, aluminum and/or boron.

A transparent conductive oxide layer 130 can be formed adjacent to barrier layer 120. Transparent conductive oxide layer 130 may include any suitable material, including, for example, an amorphous layer of cadmium and tin, tin-doped indium oxide, aluminum-doped zinc oxide, or fluorine-doped tin oxide. Transparent conductive oxide layer 130 may have any suitable thickness, including, for example, more than about 1000 A, more than about 2000 A, more than about 2500 A, or less than about 3000 A. For example, transparent conductive oxide layer 130 may have a thickness of about 2600 A.

Transparent conductive oxide layer 130 may be deposited using any suitable technique, including, for example, atmospheric pressure chemical vapor deposition, or any suitable reactive sputtering process. Like barrier layer 120, transparent conductive oxide layer 130 may be deposited in an atmosphere including one or more gases. For example, transparent conductive oxide layer 130 may be deposited in the presence of an oxygen/argon gas mix. Transparent conductive oxide layer 130 may be sputtered in an atmosphere containing any suitable oxygen and/or argon gas concentration. For example, transparent conductive oxide layer 130 may be sputtered in an atmosphere of about 0% to about 25% argon gas, or about 0% to about 5% argon gas. Transparent conductive oxide layer 130 may be sputtered from an alloy target containing cadmium and tin. For example, transparent conductive oxide layer 130 may be sputtered from a cadmium and tin alloy target having a cadmium to tin ratio of about 2:1.

A buffer layer 140 may be formed adjacent to transparent conductive oxide layer 130. Buffer layer 140 can be deposited between the TCO layer and a semiconductor window layer to reduce the likelihood of irregularities occurring during the formation of the semiconductor window layer. Buffer layer 140 may include any suitable material, including, for example, an amorphous tin oxide, zinc tin oxide, zinc oxide, tin silicon oxide, or zinc magnesium oxide, as well as zinc stannate. Buffer layer 140 may have any suitable thickness, including, for example, more than about 500 A, more than about 650 A, more than about 800 A, or less than about 1200 A. For example, buffer layer 140 may have a thickness of about 900 A.

Buffer layer 140 may be deposited using any suitable technique, including, for example, atmospheric pressure chemical vapor deposition, or any suitable reactive sputtering process. Buffer layer 140 may be deposited in an atmosphere including one or more gases. For example, buffer layer 140 may be deposited in an atmosphere having a substantial concentration of oxygen gas, including, for example, more than about 50%, more than about 70%, more than about 80%, more than about 90%, or more than about 95%. For example, buffer layer 140 may be deposited in an atmosphere including close to about 100% oxygen gas. For example, buffer layer 140 may include a tin oxide sputtered in the presence of an oxygen gas. Buffer layer 140, along with barrier layer 120 and transparent conductive oxide layer 130, can form transparent conductive oxide stack 110. Buffer layer 140 may be sputtered from a sputter target including any suitable sputter material, including, for example, a material including a tin or tin with suitable dopants.

Figure 2:
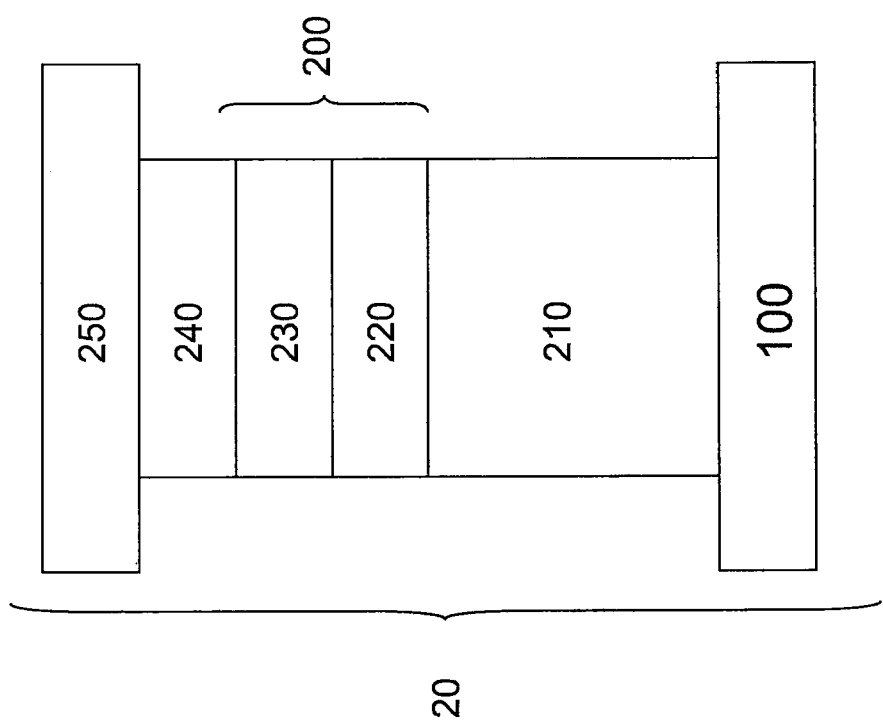
FIG. 2 is a schematic of a photovoltaic device having multiple layers.

Following deposition, transparent conductive oxide stack 110 can be used to form photovoltaic device 20 from FIG. 2. A semiconductor structure 200 can be formed adjacent to annealed transparent conductive oxide stack 210 (or adjacent to transparent conductive oxide stack 110 from FIG. 1). Semiconductor structure 200 can include a semiconductor window layer 220 and a semiconductor absorber layer 230. Semiconductor window layer 220 can include any suitable material, including, for example, cadmium sulfide, zinc sulfide, cadmium zinc sulfide, zinc oxysulfide and zinc magnesium oxide. Semiconductor window layer 220 can be formed directly on annealed transparent conductive oxide stack 210 (or on transparent conductive oxide stack 110 from FIG. 1). Semiconductor window layer 220 can be deposited using any known deposition technique, including vapor transport deposition. Semiconductor absorber layer 230 can be formed adjacent to semiconductor window layer 220. Semiconductor absorber layer 230 can include any suitable material, including, for example, cadmium telluride, zinc telluride, and cadmium zinc telluride. Semiconductor absorber layer 230 can be formed using any known deposition technique, including, for example, vapor transport deposition or close space sublimation. Semiconductor window layer 220 can include a cadmium sulfide layer. Semiconductor absorber layer 230 can include a cadmium telluride layer.

The deposition of semiconductor window layer 220 and semiconductor absorber layer 230, can cause or facilitate transformation of transparent conductive oxide layer 130. For example, semiconductor window layer 220 and semiconductor absorber layer 230 may be deposited using a high-temperature process (e.g., vapor transport deposition or close space sublimation). During semiconductor deposition, transparent conductive oxide layer 130 may transform from a substantially amorphous structure to a substantially crystalline structure. For example, transparent conductive oxide layer 130 may include an amorphous layer of cadmium and tin. Following semiconductor deposition, the amorphous layer of cadmium and tin may transform to a substantially crystalline structure (e.g., a cadmium stannate). Thus the high-temperature deposition of semiconductor layers 220 and 230 can eliminate the need for a separate anneal process, which can reduce manufacturing time and cost.

Following deposition of the semiconductor layers, a back contact 240 can be formed adjacent to semiconductor layer 200. Back contact 240 can be formed adjacent to semiconductor absorber layer 230. Back contact 240 may include any suitable material, including, for example, molybdenum, and can be formed using any suitable technique, including, for example, sputtering. A back support 250 can be formed adjacent to back contact 240. Back support 250 can include any suitable material, including, for example, glass (e.g., soda-lime glass).

Photovoltaic devices/cells fabricated using the methods discussed herein may be incorporated into one or more photovoltaic modules. The modules may by incorporated into various systems for generating electricity. For example, a photovoltaic cell may be illuminated with a beam of light to generate a photocurrent. The photocurrent may be collected and converted from direct current (DC) to alternating current (AC) and distributed to a power grid. Light of any suitable wavelength may be directed at the cell to produce the photocurrent, including, for example, more than 400 nm, or less than 700 nm (e.g., ultraviolet light). Photocurrent generated from one photovoltaic cell may be combined with photocurrent generated from other photovoltaic cells. For example, the photovoltaic cells may be part of one or more photovoltaic modules in a photovoltaic array, from which the aggregate current may be harnessed and distributed.

Figure 3:
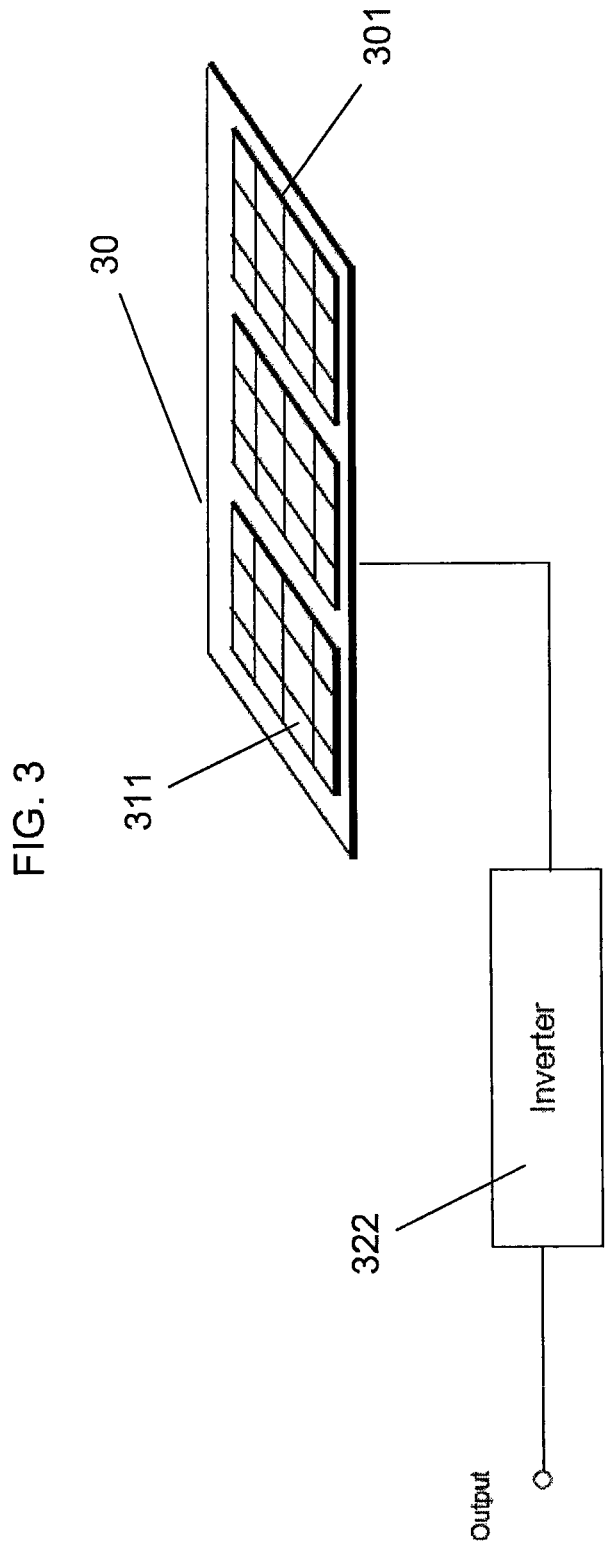
FIG. 3 is a schematic of a system for generating electricity.

Referring to FIG. 3, by way of example, a photovoltaic array 30 may include one or more interconnected photovoltaic modules 301. One or more of photovoltaic modules 501 may include one or more photovoltaic cells 311 having any of the multilayer structure or photovoltaic device configurations discussed herein. Photovoltaic array 30 may be illuminated with a light source, e.g., the sun, or any suitable artificial light source, to generate a photocurrent. For example, photovoltaic array 30 may be illuminated with a wavelength of light between about 400 nm to about 850 nm or between about 400 nm to about 700 nm. The generated photocurrent may be converted from direct current (DC) to alternating current (AC) using, for example, an inverter 322. The converted current may be output for any of a variety of uses, including, for example, connection to one or more home appliances, or to a utility grid.

The embodiments described above are offered by way of illustration and example. It should be understood that the examples provided above may be altered in certain respects and still remain within the scope of the claims. It should be appreciated that, while the invention has been described with reference to the above preferred embodiments, other embodiments are within the scope of the claims.

What is claimed is:

1. A method of manufacturing a photovoltaic device, the method comprising:
   depositing an amorphous oxide material comprising cadmium and tin over a substrate, wherein the substrate is heated during the deposition of the amorphous oxide material to form cadmium and tin oxide nano- or micro-crystallites in the amorphous oxide material;
   depositing a semiconductor material over the amorphous oxide material; and,
   transforming the amorphous oxide material into a substantially crystalline transparent conductive oxide during or after deposition of the semiconductor material, wherein the cadmium and tin nano- or micro-crystallites serve as seeds or nuclei during transformation.

2. A method as in claim 1, wherein the depositing of the amorphous oxide material comprises depositing cadmium and tin in an atmosphere comprising oxygen.

3. A method as in claim 2, wherein the atmosphere further includes argon in a concentration of up to about 25%.

4. A method as in claim 2, wherein the atmosphere further includes argon in an argon to oxygen gas ratio of about 5:1 or less.

5. A method as in claim 4, wherein the argon to oxygen gas ratio is about 1:5 or greater.

6. A method as in claim 3, wherein the argon gas has a concentration up to about 5%.

7. A method as in claim 1, further comprising forming a barrier material between the substrate and the amorphous oxide material, the barrier material selected from the group consisting of aluminum doped silicon oxide, silicon oxide, silicon nitride, silicon oxy nitride and aluminum oxide.

8. The method of claim 7, wherein forming the barrier material comprises sputtering a barrier material in an atmosphere comprising an oxygen and argon gas mix.

9. The method of claim 8, wherein the oxygen and argon gas mix comprises an argon to oxygen gas ratio of about 5:1 or less.

10. The method of claim 8, wherein the oxygen and argon gas mix comprises an argon to oxygen gas ratio of about 1:5 or more.

11. The method of claim 7, wherein forming the barrier material comprises sputtering an aluminum-doped silicon oxide or a silicon oxide.

12. The method of claim 7, wherein forming the barrier material comprises sputtering a barrier material that is substantially free of optical absorptions.

13. A method as in claim 1, further comprising forming a buffer material over the amorphous oxide material before deposition of the semiconductor material, the buffer material comprising a material selected from the group consisting of tin oxide, indium oxide, zinc oxide, and zinc tin oxide.

14. The method of claim 13, wherein forming the buffer material comprises sputtering a material selected from the group consisting of tin oxide, indium oxide, zinc oxide, and zinc tin oxide.

15. The method of claim 13, wherein forming the buffer material comprises sputtering a buffer material in an atmosphere comprising oxygen gas.

16. The method of claim 15, wherein the atmosphere comprises more than about 50% oxygen.

17. The method of claim 1, further comprising exposing the amorphous oxide material to a first zone temperature prior to deposition of a cadmium sulfide material, wherein the cadmium sulfide material is part of the semiconductor material.

18. The method of claim 17, wherein the first zone temperature is set to about 600° C.

19. The method of claim 17, wherein forming a semiconductor material comprises exposing the amorphous oxide material to a second zone temperature during or after deposition of the cadmium sulfide material.

20. The method of claim 19, wherein the second zone temperature comprises a range of about 600° C. to about 650° C.

21. The method of claim 1, wherein deposition of the semiconductor material occurs in an oxygen-depleted environment.

22. The method of claim 21, wherein the oxygen-depleted environment is provided by deposition of a cadmium sulfide layer as part of the semiconductor material.

23. The method of claim 1, wherein depositing an amorphous oxide material comprises sputtering an amorphous material of cadmium and tin in an atmosphere comprising an argon and oxygen gas mix.

24. The method of claim 23, wherein the atmosphere comprises about 0% to about 25% argon gas.

25. The method of claim 1, wherein the transforming occurs during deposition of the semiconductor material.

26. A method as in claim 25, wherein the deposition of the semiconductor material occurs within a temperature range of about 550° C. to about 650° C.

27. The method of claim 1, wherein the transforming comprises transporting a vapor.

28. The method of claim 1, wherein the transforming occurs during close space sublimation to form a semiconductor material bi-layer.

29. The method of claim 1, wherein depositing an amorphous oxide material comprises sputtering an amorphous layer of cadmium and tin.

30. The method of claim 1, wherein depositing an amorphous oxide material comprises sputtering an amorphous material of cadmium and tin from a sputter target comprising a cadmium to tin ratio of about 2:1 in an atmosphere comprising oxygen gas.

31. The method of claim 1, wherein depositing the semiconductor material comprises:
   forming a semiconductor bi-layer comprising the steps of:
      transporting a stack comprising the substrate and amorphous oxide material to a first deposition zone;
      forming a cadmium sulfide layer on the stack at the first deposition zone;
      transporting the stack from the first deposition zone to a second deposition zone; and
      forming a cadmium telluride layer on the cadmium sulfide layer at the second deposition zone;
   wherein the transforming step occurs during the forming of the semiconductor bi-layer.

32. The method of claim 1, wherein the semiconductor material comprises a cadmium telluride material adjacent to a cadmium sulfide material.

33. A method as in claim 1, wherein the amorphous oxide material is formed in a manner which produces nano- or micro-crystallites in the amorphous oxide material but which does not form a substantially crystalline material.

34. A method of manufacturing a photovoltaic module, the method comprising:
   fabricating a plurality of photovoltaic cells, the fabricating comprising:
      forming a barrier layer over a substrate, the barrier layer comprising a material selected from the group consisting of aluminum-doped silicon oxide, silicon oxide, silicon nitride, silicon oxynitride, and aluminum oxide;
      forming an amorphous oxide layer over the barrier layer, wherein the amorphous oxide layer comprises cadmium and tin and wherein the substrate is heated during the forming of the amorphous oxide layer to form cadmium and tin oxide nano- or micro-crystallites in the amorphous oxide layer;
      forming a buffer layer over the amorphous oxide layer including the formed crystallites, the buffer layer comprising a material selected from the group consisting of tin oxide, indium oxide, zinc oxide, and zinc tin oxide;
      forming a semiconductor layer over the buffer layer; and,
      transforming the amorphous oxide layer into a crystalline transparent conductive oxide layer, during or after deposition of the semiconductor layer over the buffer layer, wherein the cadmium and tin oxide nano- or micro-crystallites serve as seeds or nuclei during transformation;
   connecting the plurality of the photovoltaic cells; and
   depositing a back cover over the plurality of photovoltaic cells.

* * * * *